United States Patent
Yeh

(10) Patent No.: US 9,448,607 B2
(45) Date of Patent: Sep. 20, 2016

(54) IRREGULARITY DETECTION DEVICE FOR A POWER SWITCH

(71) Applicant: Acbel Polytech Inc., New Taipei (TW)

(72) Inventor: Chia-An Yeh, New Taipei (TW)

(73) Assignee: Acbel Polytech Inc., New Taipei (TW)

( * ) Notice: Subject to any disclaimer, the term of this patent is extended or adjusted under 35 U.S.C. 154(b) by 180 days.

(21) Appl. No.: 14/529,673

(22) Filed: Oct. 31, 2014

(65) Prior Publication Data

US 2016/0126720 A1 May 5, 2016

(51) Int. Cl.
| | |
|---|---|
| *G06F 1/28* | (2006.01) |
| *H02H 3/20* | (2006.01) |
| *H02H 7/12* | (2006.01) |
| *G06F 1/26* | (2006.01) |
| *H03K 17/14* | (2006.01) |
| *H02M 1/42* | (2007.01) |
| *H02M 3/335* | (2006.01) |
| *H02M 1/00* | (2006.01) |
| *H02M 1/32* | (2007.01) |

(52) U.S. Cl.
CPC . *G06F 1/28* (2013.01); *G06F 1/26* (2013.01); *H02H 3/20* (2013.01); *H02H 7/1213* (2013.01); *H03K 17/145* (2013.01); *H02M 1/42* (2013.01); *H02M 1/4225* (2013.01); *H02M 3/335* (2013.01); *H02M 3/33546* (2013.01); *H02M 2001/007* (2013.01); *H02M 2001/0058* (2013.01); *H02M 2001/327* (2013.01); *H03K 2217/0027* (2013.01)

(58) Field of Classification Search
CPC .............. G06F 1/26; G06F 1/28; G06F 1/30; H02H 3/20; H02H 7/1213; H02M 1/42; H02M 1/4225; H02M 3/335; H02M 3/33546; H02M 2001/0058; H02M 2001/007; H02M 2201/327; H03K 17/145; H03K 2217/0027
See application file for complete search history.

(56) References Cited

U.S. PATENT DOCUMENTS

| | | | | |
|---|---|---|---|---|
| 6,137,668 A | * | 10/2000 | Feldtkeller | H03K 17/0822 361/103 |
| 2006/0028257 A1 | * | 2/2006 | Huang | H03K 17/0822 327/175 |
| 2011/0291489 A1 | * | 12/2011 | Tsai | H02J 17/00 307/104 |

* cited by examiner

*Primary Examiner* — Dennis M Butler
(74) *Attorney, Agent, or Firm* — C. G. Mersereau; Nikolai & Mersereau, P.A.

(57) ABSTRACT

An irregularity detection device for a power switch determines if a temperature-dependent resistance on a current path of the power switch is abnormal according to if a voltage on the current path is greater than or equal to a configuration value when the power switch is turned on, and generates an irregularity alarm associated with the power switch based on the determination result.

19 Claims, 7 Drawing Sheets

IRREGULARITY DETECTION DEVICE FOR A POWER SWITCH

BACKGROUND OF THE INVENTION

1. Field of the Invention

The present invention relates to an irregularity detection device for a power switch and, more particularly, to a technique pertinent to generation of irregularity alarm report according to if a temperature-dependent on-resistance of a power switch is abnormal.

2. Description of the Related Art

Power switch is a transistor with larger current withstanding capability, less leakage current and better switching characteristics during saturation and cut-off. One of the most prevalent power switches is MOSFET (Metal oxide semiconductor field effect transistor). In view of the foregoing characteristics, power switch is usually applied to power supply equipment, such as switching power supply. With reference to FIG. 7, a conventional switching power supply has a rectification circuit 81, a PFC (Power Factor Correction) circuit 82 and a DC (Direct Current) to DC conversion circuit 83. The PFC circuit 82 has an inductor L1, a diode, a first power switch S1 and a PFC controller located on a DC circuit loop. The DC to DC conversion circuit 83 has a transformer T1, a PWM (pulse width modulation) controller U1 and a second power switch S2. One control terminal of the PWM controller U1 is connected to the second power switch S2. The second power switch S2 is connected to the primary side of the transformer T1.

It can be seen that the conventional switching power supply fully utilizes the power switches as switching elements to adjust the power factor of the switching power supply and perform power conversion. As the conventional PWM controller U1 controls the second power switch S2 by means of a hard switching approach, waveforms associated with switch terminal voltage and current overlap and the overlapping area is not equal to zero. Thus, the second power switch S2 is subject to significant operating characteristics variation when turned on or turn off. In addition to electromagnetic interference, the second power switch is damage-prone because of frequent switching and large operating characteristics variation. To improve the issue arising from the hard switching, a soft switching approach has been developed and brought to the market. The soft switching approach targets at reducing the overlapping area of the voltage and current of a power switch at a switching transient and can even shrink the overlapping area to achieve zero switching loss. Physical implementations about the soft switching approach include zero current switching (ZCS) and zero voltage switching (ZVS).

Although the PWM controller employs the soft switching approach to resolve the issue arising from the hard switching of the second power switch S2, the PFC circuit 82 in the same switching power supply still controls a first power switch S1 by means of the hard switching for the concern of circuit characteristics. Due to frequent hard-switching operation and switching loss, the first power switch S1 becomes failure-prone as a result of abnormal temperature rise. To ensure that power switch in a system can operate stably, irregular working characteristics must be monitored and controlled constantly.

SUMMARY OF THE INVENTION

An objective of the present invention is to provide an irregularity detection device for a power switch utilizing temperature-dependent resistance variation of a power switch as a basis of determining if the power switch is abnormal and constantly monitoring operating condition of the power switch to ensure stability of equipment using the power switch.

To achieve the foregoing objective, the irregularity detection device for a power switch is connected to a current path of a power switch and has a voltage-dividing circuit and a voltage-controlled switch.

The voltage-dividing circuit has a voltage-dividing node.

The voltage-controlled switch is connected between the voltage-dividing node of the voltage-dividing circuit and the current path of the power switch. When a voltage on the current path of the power switch is less than a first configuration value, the voltage-controlled switch is turned on for a voltage at the voltage-dividing node to be less than a second configuration value. When the voltage on the current path of the power switch is greater than or equal to the first configuration value, the voltage-controlled switch is turned off for the irregularity detection device to generate an irregularity alarm when the voltage at the voltage-dividing node is greater than or equal to the second configuration value.

The present invention utilizes a relationship that the on-resistance of the power switch is proportional to the temperature of the power switch to determine if the voltage on the current path of the power switch is greater than a configuration value, and to further analyze if the on-resistance abnormally rises as a criterion of generating the irregularity alarm for abnormal temperature rise of the power switch. Accordingly, working characteristics of the power switch can be constantly monitored and stability of system using the power switch can be ensured.

Other objectives, advantages and novel features of the invention will become more apparent from the following detailed description when taken in conjunction with the accompanying drawings.

DETAILED DESCRIPTION OF THE INVENTION

Figure 1:
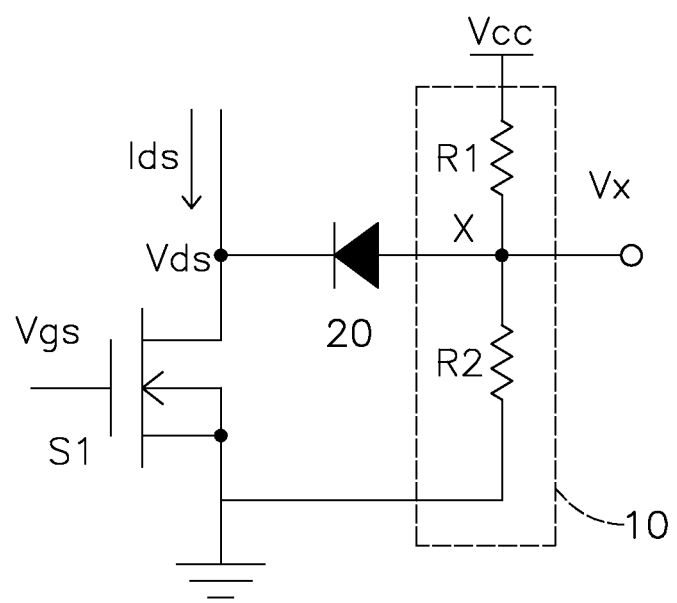
FIG. 1 is a circuit diagram of a first embodiment of an irregularity detection device for a power switch in accordance with the present invention.

With reference to FIG. 1, a first embodiment of an irregularity detection device 1 for a power switch in accordance with the present invention is parallelly connected to a current path of a power switch S1, and has a voltage-dividing circuit 10 and a voltage-controlled switch 20. The voltage-dividing circuit 10 has a voltage-dividing node X. The voltage-controlled switch 20 is connected between the voltage-dividing node X of the voltage-dividing circuit 10 and the current path of the power switch S1.

The power switch S1 may be a MOSFET and, specifically, an n-type MOSFET (NMOS). However, the power switch S1 includes but is not limited to NMOS.

The power switch S1 has a drain, a source and a gate. The current path is formed between the drain and the source. The drain of the power switch S1 is connected to the voltage-dividing node X of the voltage-dividing circuit 10 through the voltage-controlled switch 20. The source of the power switch S1 is connected to the ground. The gate of the power switch S1 is a control terminal.

The voltage-dividing circuit 10 has a first resistor R1 and a second resistor R2. The first resistor R1 and the second resistor R2 is connected in series with each other with the voltage-dividing node X located on one common end of the first resistor R1 and the second resistor R2. The other end of the first resistor R1 is connected to a DC voltage source Vcc. The other end of the second resistor R2 is connected to the source of the power switch S1 and to the ground. A second configuration value V2 can be determined by a voltage-dividing equation with values of the DC voltage source Vcc, the first resistor R1 and the second resistor R2 in the voltage-dividing circuit 10 as variables in the voltage-dividing equation, is a constant, and is a normal voltage value measured from the voltage-dividing node X.

In the present embodiment, the voltage-controlled switch 20 is a diode with an anode connected to the voltage-dividing node X of the voltage-dividing circuit 10 and a cathode connected to the drain of the power switch S1. In other words, the voltage-dividing node X of the voltage-dividing circuit 10 is connected to the drain of the power switch through the forward-based diode.

Figure 2A:
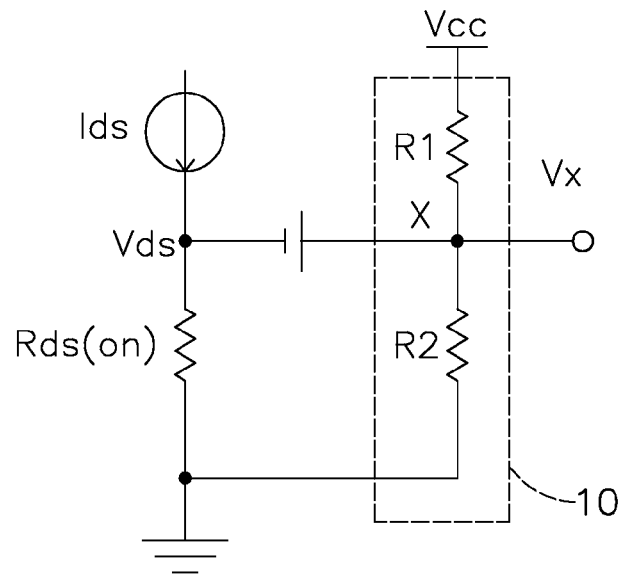
FIGS. 2A and 2B are equivalent circuit diagrams of the irregular detection device in FIG. 1.

Given the foregoing circuit structure, when the power switch turns on, a drain-to-source voltage Vds of the power switch S1 (the voltage on the current path) is small, the voltage-controlled switch 20 is forward-biased and turned on, the voltage Vx at the voltage-dividing node X of the voltage-dividing circuit 10 is dropped down and is less than the second configuration value V2, and an equivalent circuit is shown in FIG. 2A.

The voltage Vx at the voltage-dividing node X of the voltage-dividing circuit 10 is expressed by the following equation.

$$Vx = \frac{Vcc/R2 + (Vf + Ids \cdot Rds(on))/Rds}{\frac{1}{R1} + \frac{1}{R2} + \frac{1}{Rds(on)}}$$

where

Vf represents a forward-based voltage of the voltage-controlled switch 20;

Rds(on) represents an on-resistance of the power switch S1.

Figure 2B:
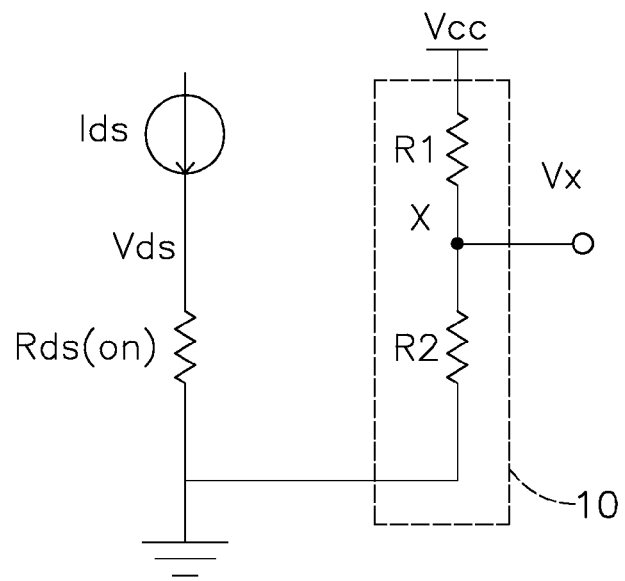
Figure 3:
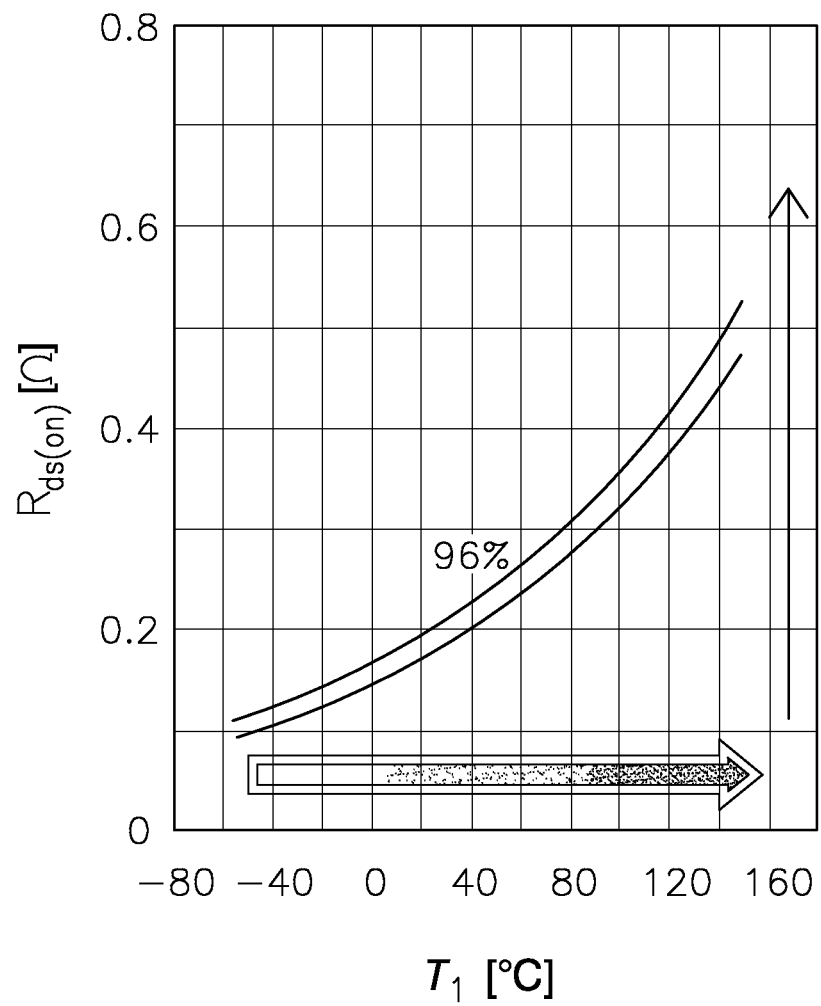
FIG. 3 is a curve diagram showing a relationship between temperature and on-resistance of a power switch.

However, with reference to FIG. 3, when the temperature of the power switch S1 increases at a constant current, the on-resistance Rds(on) of the power switch S1 also increases. The drain-to-source voltage Vds, which is equal to a product of a drain-to-source current Ids and the on-resistance Rds(on), increases with the on-resistance Rds(on). When the drain-to-source voltage Vds is greater than a first configuration value, the voltage-controlled switch 20 cuts off as illustrated by an equivalent circuit in FIG. 2B. When the voltage Vx at the voltage-dividing node X of the voltage-dividing circuit 10 is determined to be equal to the second configuration value V2, an irregularity alarm can thus be generated, and the voltage Vx at the voltage-dividing node X of the voltage-dividing circuit 10 is expressed as follows:

$$Vx = V2 = Vcc \times R2/(R1+R2)$$

When the voltage-controlled switch 20 is a diode, the first configuration value V1 is equal to the forward-biased voltage, which is approximately 0.7V.

Figure 4:
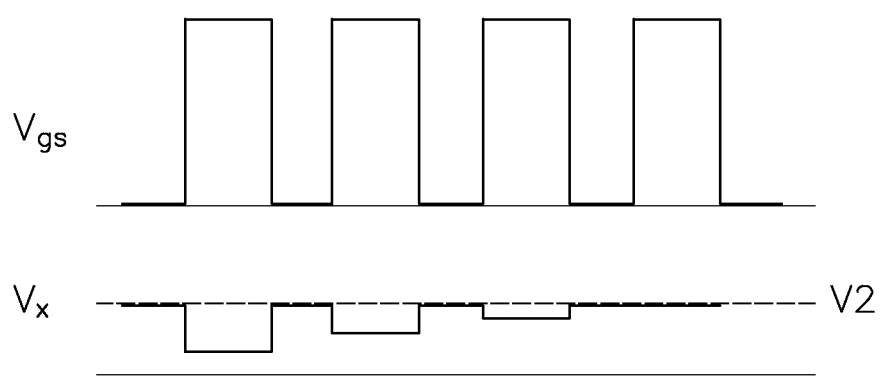
FIG. 4 is a waveform diagram showing voltage of a voltage-dividing node in a voltage-dividing circuit of the irregularity detection device in FIG. 1 sampled by a digital controller.

The voltage Vx at the voltage-dividing node X of the voltage-dividing circuit 10 can be obtained by a digital controller through a sampling means. Besides performing the sampling, the digital controller simultaneously controls the power switch S1 to turn on. With reference to FIG. 4, the digital controller drives the power switch S1 with a driving signal Vgs to periodically turn on the power switch S1 and to sample the voltage Vx at the voltage-dividing node X during each duty cycle of the power switch S1. When any sampled voltage Vx at the voltage-dividing node X is equal to the second configuration value V2, the digital controller generates the irregularity alarm.

Figure 5:
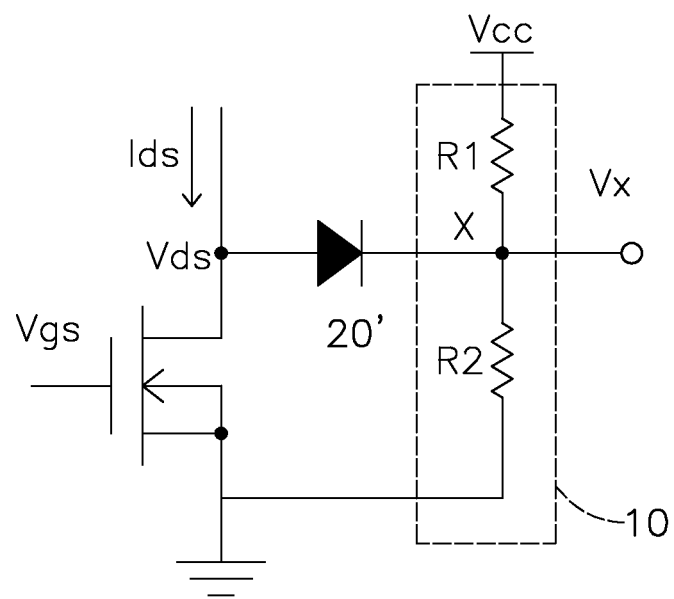
FIG. 5 is a circuit diagram of a second embodiment of an irregularity detection device for a power switch in accordance with the present invention.

With reference to FIG. 5, a second embodiment of an irregularity detection device 1 for a power switch in accordance with the present invention differs from the foregoing embodiment in that the cathode of the diode is connected to the voltage-dividing node X of the voltage-dividing circuit 10 and the anode of the diode is connected to the drain of the power switch S1.

In the present embodiment, the second configuration value V2 should be always greater than the voltage at the voltage-dividing node X, and the value of the second configuration value V2 can be configured by users. When the power switch S1 is turned on, if the on-resistance Rds(on) is normal, the drain-to-source voltage Vds is less than the forward-biased voltage of the diode such that the voltage at the voltage-dividing node X of the voltage-dividing circuit 10 should be less than the second configuration value V2 and no irregularity alai in will be generated. When the temperature of the power switch abnormally rises, the on-resistance Rds(on) also increases. When the drain-to-source voltage Vds is greater than the forward-biased voltage of the diode, the voltage Vx at the voltage-dividing node X of the voltage-dividing circuit 10 also increases. When the voltage Vx at the voltage-dividing node X is greater than and equal to the second configuration value, the irregularity alarm is generated.

Figure 6:
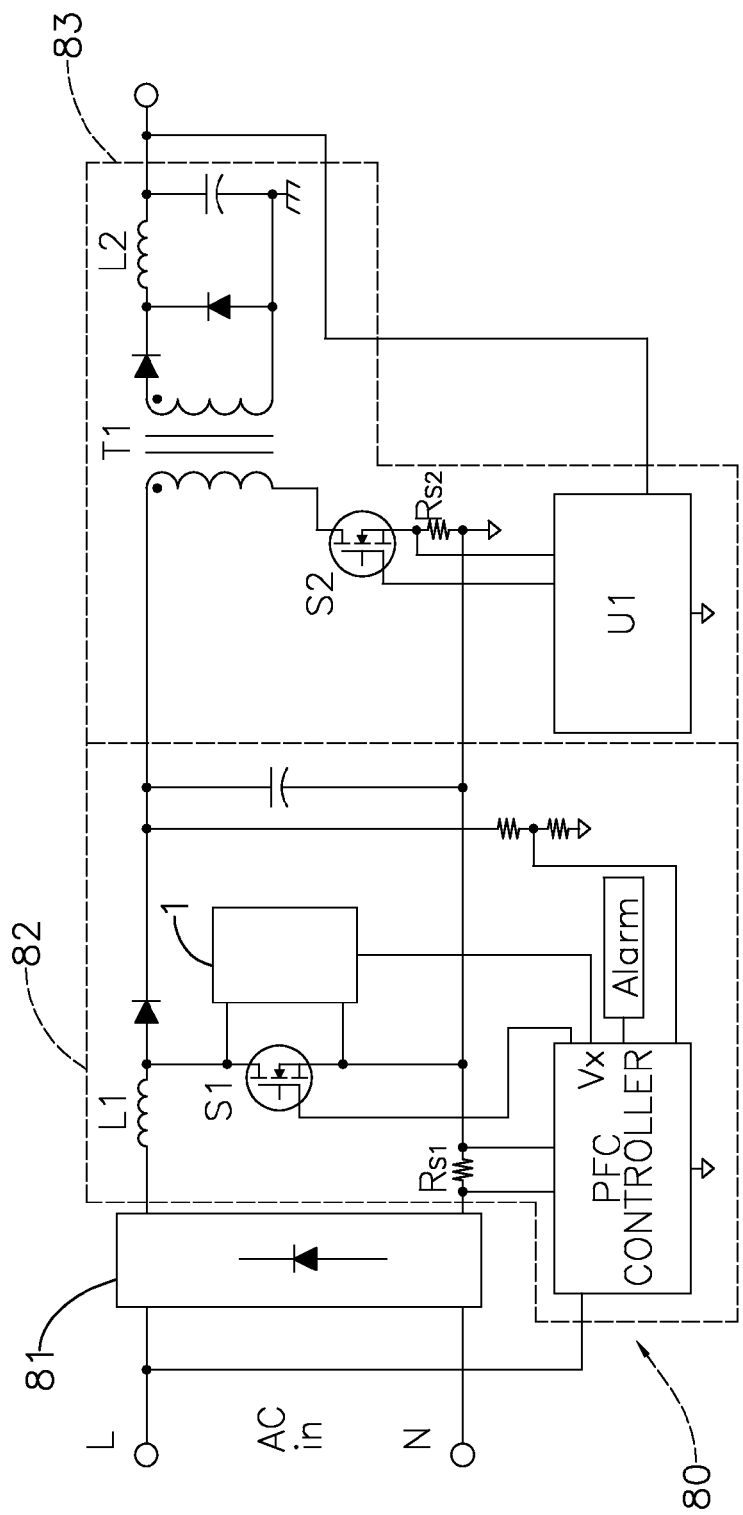
FIG. 6 is a circuit diagram of the irregularity detection device in FIG. 1 or FIG. 5 applied to a switching power supply.
Figure 7:
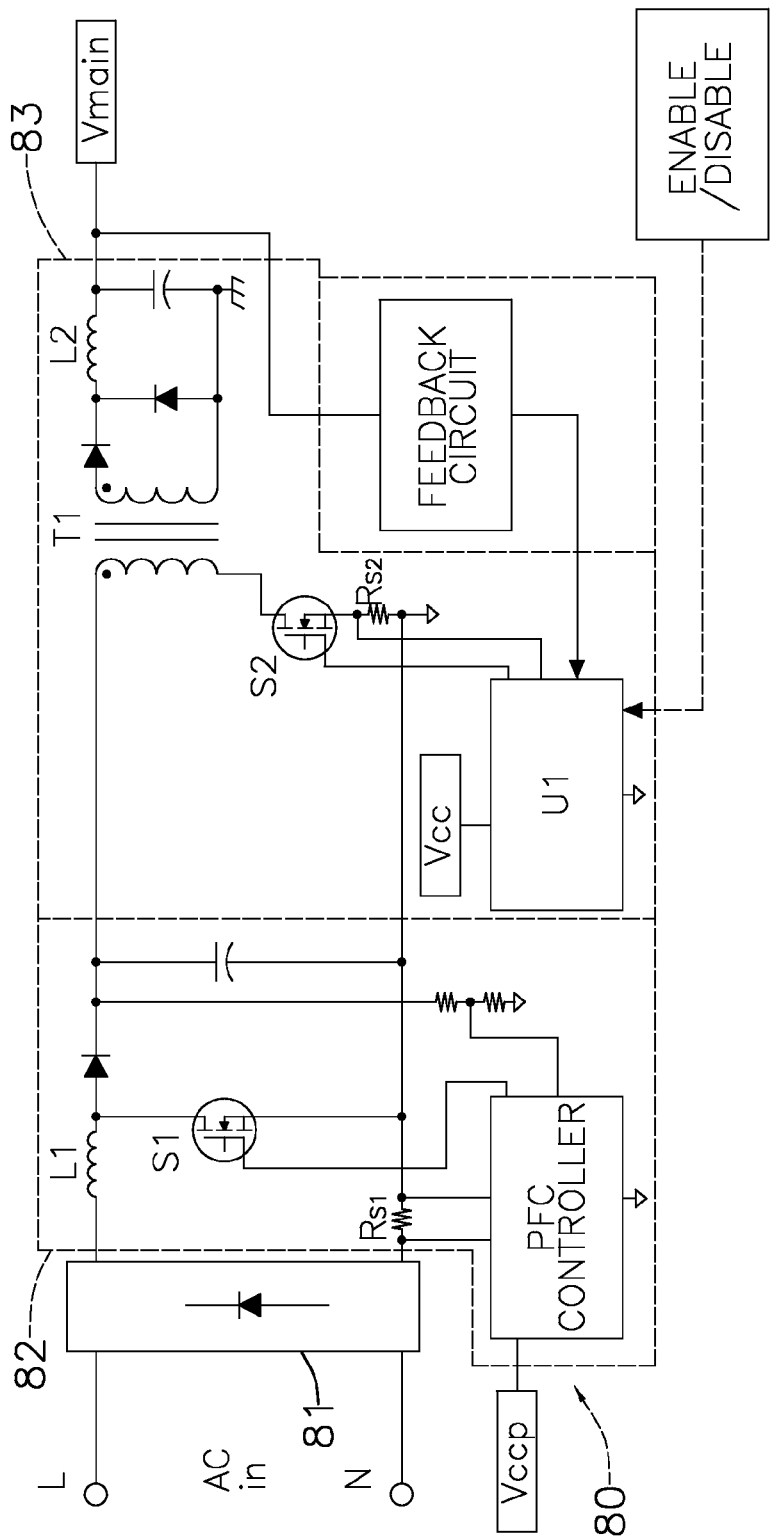
FIG. 7 is a circuit diagram of a conventional switching power supply.

With reference to FIG. 6, when the power switch S1 is applied to a power factor correction (PFC) circuit 82, the digital controller may be a PFC controller in the PFC circuit 82. The irregularity detection device 1 is connected to the drain and the source of the power switch S1 and the PFC controller. The PFC controller is further connected to an alarm module for generating the irregularity alarm when the voltage Vx at the voltage-dividing node X is greater than or equal to the second configuration value V2. When the power switch S1 is applied to a DC to DC conversion circuit, the digital controller may be a pulse width modulation (PWM) controller.

In sum, the present invention utilizes a relationship that the on-resistance of the power switch is proportional to the temperature of the power switch to determine if the voltage on the current path of the power switch is greater than a configuration value, and to further analyze if the on-resistance abnormally rises as a criterion of generating the irregularity alarm for abnormal temperature rise of the power switch. Accordingly, working characteristics of the power switch can be constantly monitored and a timely alarm is generated in the case of an abnormal condition of the power switch, such that system stability and damage avoidance to the system can be ensured.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. An irregularity detection device for a power switch, wherein the irregularity detection device is connected to a current path of a power switch and comprises:
    a voltage-dividing circuit having a voltage-dividing node; and
    a voltage-controlled switch connected between the voltage-dividing node of the voltage-dividing circuit and the current path of the power switch;
    wherein
    when a voltage on the current path of the power switch is less than a first configuration value, the voltage-controlled switch is turned on for a voltage at the voltage-dividing node to be less than a second configuration value; and
    when the voltage on the current path of the power switch is greater than or equal to the first configuration value, the voltage-controlled switch is turned off for the irregularity detection device to generate an irregularity alarm when the voltage at the voltage-dividing node is greater than or equal to the second configuration value.

2. The irregularity detection device as claimed in claim 1, wherein the voltage-controlled switch is a diode.

3. The irregularity detection device as claimed in claim 2, wherein an anode of the voltage-controlled switch is connected to the voltage-dividing node of the voltage-dividing circuit, and a cathode of the voltage-controlled switch is connected to the current path of the power switch.

4. The irregularity detection device as claimed in claim 3, wherein the power switch has a drain, a source and a gate, and the voltage-dividing circuit has a first resistor and a second resistor, wherein the first resistor and the second resistor are connected in series with each other, the voltage-dividing node is located at a common end of the first resistor and the second resistor, the other end of the first resistor is connected to a DC (Direct Current) voltage source, and the other end of the second resistor is connected to the source of the power switch and to the ground.

5. The irregularity detection device as claimed in claim 4, wherein the second configuration value is determined by a voltage-dividing equation with values of the DC voltage source, the first resistor and the second resistor in the voltage-dividing circuit as variables in the voltage-dividing equation.

6. The irregularity detection device as claimed in claim 5, wherein the first configuration value is a forward-biased voltage of the voltage-controlled switch.

7. The irregularity detection device as claimed in claim 1, wherein the power switch is a MOSFET (Metal Oxide Semiconductor Field Effect Transistor), and the current path is formed between a drain and a source of the power switch.

8. The irregularity detection device as claimed in claim 1, wherein the voltage-dividing node of the voltage-dividing circuit is connected to a digital controller.

9. The irregularity detection device as claimed in claim 6, wherein the voltage-dividing node of the voltage-dividing circuit is connected to a digital controller.

10. The irregularity detection device as claimed in claim 7, wherein the voltage-dividing node of the voltage-dividing circuit is connected to a digital controller.

11. The irregularity detection device as claimed in claim 8, wherein the digital controller drives the power switch with a driving signal to periodically turn on the power switch and to sample the voltage at the voltage-dividing node during each duty cycle of the power switch.

12. The irregularity detection device as claimed in claim 9, wherein the digital controller drives the power switch with a driving signal to periodically turn on the power switch and to sample the voltage at the voltage-dividing node during each duty cycle of the power switch.

13. The irregularity detection device as claimed in claim 10, wherein the digital controller drives the power switch with a driving signal to periodically turn on the power switch and to sample the voltage at the voltage-dividing node during each duty cycle of the power switch.

14. The irregularity detection device as claimed in claim 8, wherein the digital controller is a power factor correction (PFC) controller.

15. The irregularity detection device as claimed in claim 9, wherein the digital controller is a power factor correction (PFC) controller.

16. The irregularity detection device as claimed in claim 10, wherein the digital controller is a power factor correction (PFC) controller.

17. The irregularity detection device as claimed in claim 8, wherein the digital controller is a pulse width modulation (PWM) controller.

18. The irregularity detection device as claimed in claim 9, wherein the digital controller is a pulse width modulation (PWM) controller.

19. The irregularity detection device as claimed in claim 10, wherein the digital controller is a pulse width modulation (PWM) controller.

* * * * *